United States Patent
Moussa

(10) Patent No.: US 11,370,928 B2
(45) Date of Patent: Jun. 28, 2022

(54) INKS FOR 3D PRINTING HAVING LOW POLYMERIZATION SHRINKAGE

(71) Applicant: 3D Systems, Incorporated, Rock Hill, SC (US)

(72) Inventor: Khalil Moussa, Rock Hill, SC (US)

(73) Assignee: 3D SYSTEMS, INC., Rock Hill, SC (US)

( * ) Notice: Subject to any disclaimer, the term of this patent is extended or adjusted under 35 U.S.C. 154(b) by 0 days.

(21) Appl. No.: 16/691,249

(22) Filed: Nov. 21, 2019

(65) Prior Publication Data

US 2020/0172748 A1 Jun. 4, 2020

Related U.S. Application Data

(60) Provisional application No. 62/773,370, filed on Nov. 30, 2018.

(51) Int. Cl.

| | |
|---|---|
| *C08F 2/46* | (2006.01) |
| *C08F 2/50* | (2006.01) |
| *C08G 61/04* | (2006.01) |
| *C09D 11/101* | (2014.01) |
| *B33Y 10/00* | (2015.01) |
| *B29C 64/124* | (2017.01) |
| *C08F 20/28* | (2006.01) |
| *C08F 20/36* | (2006.01) |
| *C09D 11/104* | (2014.01) |
| *B33Y 70/00* | (2020.01) |
| *B33Y 80/00* | (2015.01) |
| *C08K 5/00* | (2006.01) |

(52) U.S. Cl.
CPC .......... *C09D 11/101* (2013.01); *B29C 64/124* (2017.08); *B33Y 10/00* (2014.12); *C08F 20/28* (2013.01); *C08F 20/36* (2013.01); *C09D 11/104* (2013.01); *B33Y 70/00* (2014.12); *B33Y 80/00* (2014.12); *C08K 5/0025* (2013.01)

(58) Field of Classification Search
CPC ..... C09D 11/104; C09D 11/101; C08F 20/28; C08F 20/36; C08F 7/0037; C08F 7/027; Y02P 10/25; C08K 5/0025; B33Y 70/10; B33Y 70/00; B33Y 10/00; B33Y 80/00; B29C 64/124; B22F 10/10
USPC ................................................... 522/1; 520/1
See application file for complete search history.

(56) References Cited

U.S. PATENT DOCUMENTS

| | | | |
|---|---|---|---|
| 5,047,261 A | 9/1991 | Moussa et al. | |
| 2016/0145452 A1* | 5/2016 | Fong | C09D 11/30 428/201 |
| 2017/0260418 A1* | 9/2017 | Wu | B33Y 10/00 |

FOREIGN PATENT DOCUMENTS

| | | | |
|---|---|---|---|
| CN | 105116686 | 12/2015 | |
| CN | 105131201 | 12/2015 | |
| JP | 2001019729 | * 1/2001 | |
| JP | 2011241251 | * 12/2011 | |
| WO | 0242383 | 5/2002 | |
| WO | WO-2016164220 A1 | * 10/2016 | ............ D06P 5/30 |

OTHER PUBLICATIONS

Ozaki et al, JP 2001-019729 Machine Translation, Jan. 23, 2001 (Year: 2001).*
Higuchi et al, JP 2011-241251 Machine Translation, Dec. 1, 2011 (Year: 2011).*
PCT International Search Report for International Search Authority for PCT/US2019/062658, dated Mar. 11, 2020.
PCT Written Opinion for International Search Authority for PCT/US2019/062658, dated Mar. 11, 2020.
English machine translation of Chinese Publication No. 105116686, Dec. 2, 2015.
English machine translation of Chinese Publication No. 105131201, Dec. 9, 2015.
Melchels F P W et al: "A review on stereolithography and its application in biomedical engineering", Biomaterials, Elsevier Science Publishers BV., Barkinh, GB, vol. 31, No. 24, Aug. 1, 2010 (Aug. 1, 2010), pp. 6121-6130, XP027474515, ISSN: 0142-9612, DOI: 10.1016/J.BIOMATERIALS.2010,04.050 [retrieved on May 15, 2010] paragraph 3. Stereolithography on pp. 6122-6124; figure 3.
DeHoff, R.T., Engineering of Microstructures, Materials Research, vol. 2, No. 3, pp. 111-126, 1999.
Kohn, Kathryn P. et al., Connecting Structure-Property and Structure-Function Relationships across the Disciplines of Chemistry and Biology: Exploring Student Perceptions, CBE Life Sci Educ., 2018 Summer; 17(2): ar33, 29 pages.
Aguilera, Jose M. et al., Chapter 12 Structure-Property Relationships in Foods, 2 pages.
Wikipedia, Materials Science, https://en.wikipedia.org/wiki/Materials_science, 18 pages.

* cited by examiner

*Primary Examiner* — Jessica Whiteley
(74) *Attorney, Agent, or Firm* — Nexsen Pruet, PLLC

(57) ABSTRACT

In one aspect, inks for use with a three-dimensional (3D) printing system are described herein. In some embodiments, an ink described herein comprises 20-60 wt. % oligomeric curable material; 10-50 wt. % cyclocarbonate (meth)acrylate monomer; and 0.1-5 wt. % photoinitiator, based on the total weight of the ink. Additionally, in some cases, the ink further comprises one or more additional curable materials differing from the oligomeric curable material and the cyclocarbonate (meth)acrylate monomer. An ink described herein, in some embodiments, also comprises one or more additional component that are non-curable.

27 Claims, No Drawings

INKS FOR 3D PRINTING HAVING LOW POLYMERIZATION SHRINKAGE

RELATED APPLICATION DATA

The present application claims priority pursuant to 35 U.S.C. § 119(e) to U.S. Provisional Patent Application Ser. No. 62/773,370 filed Nov. 30, 2018, which is incorporated herein by reference in its entirety.

FIELD

The present invention relates to inks for use with three-dimensional (3D) printing systems.

BACKGROUND

Some commercially available 3D printers or additive manufacturing systems, such as the Projet™ 3D Printers manufactured by 3D Systems of Rock Hill, S.C., use inks, which are also known as build materials, that are jetted through a print head as a liquid to form various 3D objects, articles, or parts. Other 3D printing systems also use an ink that is jetted through a print head or otherwise dispensed onto a substrate. In some instances, the ink is solid at ambient temperatures and converts to liquid at elevated jetting temperatures. In other instances, the ink is liquid at ambient temperatures. Moreover, in some cases, the ink can be cured following dispensing and/or deposition of the ink onto the substrate. Curing can be achieved using a laser or other source of electromagnetic radiation.

Other 3D printers form 3D articles from a reservoir, vat, or container of a fluid ink or build material or a powdered ink or build material. In some cases, a binder material or a laser or other source is used to selectively solidify or consolidate layers of the ink or build material in a stepwise fashion to provide the 3D article.

Many inks used in additive manufacturing include (meth)acrylates as a major or primary component. However, polymerization of (meth)acrylates, including light-induced polymerization such as occurs during photocuring, can result in volumetric polymerization shrinkage of the ink. This volumetric shrinkage can limit the use of (meth)acrylates in various additive manufacturing systems. This shrinkage can also reduce printing resolution and/or fidelity of the printed article to the desired geometry (e.g., with reference to the relevant computer aided design (CAD) parameters associated with the article). Moreover, many previous (meth)acrylate-based inks have lower notched impact strength and/or tear strength than desired for some applications.

Therefore, there exists a need for improved methods and inks for 3D printing that have improved volumetric polymerization shrinkage properties, improved printing resolution/fidelity, and/or improved strength (e.g., tear strength). A need also exists for inks that can provide one or more of the foregoing properties while also allowing other properties to be modified as desired by the use of additional components, other than the primary curable components of the inks.

SUMMARY

In one aspect, inks for use with a 3D printer are described herein, which, in some embodiments, may offer one or more advantages over prior inks, particularly (meth)acrylate-containing inks for use in additive manufacturing. For example, inks described herein can be used to print articles with reduced or improved volumetric polymerization shrinkage. Inks described herein can also be used to print articles with improved accuracy and/or precision. Additionally, inks described herein, in some cases, can be used to form articles having a poly(meth)acrylate network and also having improved impact strength and/or tear strength, when compared to other articles formed from other (meth)acrylate inks not according to the present invention. Further, inks described herein, in some embodiments, provide one or more of the foregoing advantages without sacrificing speed of the additive manufacturing process. Moreover, inks described herein can be used in a variety of different 3D printers or additive manufacturing systems, such as those based on Stereolithography (SLA), Digital Light Processing (DLP), and Multi-Jet Printing (MJP).

In some embodiments, an ink for use in a 3D printing system described herein comprises 20-60 wt. % oligomeric curable material; 10-50 wt. % cyclocarbonate (meth)acrylate monomer; and 0.1-5 wt. % photoinitiator, based on the total weight of the ink. Additionally, in some cases, the ink further comprises one or more additional curable materials differing from the oligomeric curable material and the cyclocarbonate (meth)acrylate monomer. An ink described herein, in some embodiments, also comprises one or more additional components that are non-curable. For instance, in some cases, an ink described herein further comprises at least one colorant, at least one filler, at least one inhibitor, at least one stabilizing agent, or a combination of two or more of the foregoing. It is to be understood, of course, that the total amount of the oligomeric curable material, cyclocarbonate (meth)acrylate monomer, photoinitiator, additional curable material (if present), and one or more additional non-curable components (if present) is equal to 100 wt. % (for a given ink).

Moreover, in general, the oligomeric curable material of an ink described herein comprises one or more ethylenically unsaturated species having a molecular weight (e.g., a weight average molecular weight) of 500-6,000. Further, in some instances, the oligomeric curable material comprises one or more ethylenically unsaturated species having a dynamic viscosity of 1,000 to 250,000 cP or 1,000 to 200,000 cP at 50° C., when measured according to ASTM D2983. In some cases, the oligomeric curable material comprises one or more aliphatic urethane (meth)acrylates. Moreover, in some preferred embodiments, the oligomeric curable material is present in the ink in an amount of 25-50 wt. %, based on the total weight of the ink.

In addition, the cyclocarbonate (meth)acrylate monomer of an ink described herein generally has the structure of Formula (A1):

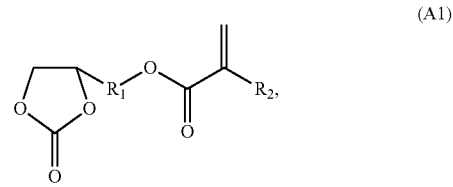

(A1)

wherein $R_1$ is selected from the group consisting of a linear or branched C1-C6 alkylene moiety, a C1-C4 alkylene moiety, an alkylene-carbonate moiety, an alkylene-ester moiety, and an alkylene-amide moiety; and wherein $R_2$ is H or $CH_3$. For reference purposes herein, it is to be understood that a "Cn-Cm alkylene moiety" (e.g., a "C1-C6 alkylene moiety") is a bivalent saturated aliphatic radical having from "n" to "m" carbon atoms (e.g., 1 to 6 carbon atoms, and no more than 6 carbon atoms). In some preferred embodiments, $R_1$ is $CH_2$ and $R_2$ is H. Moreover, in some preferred embodiments, the cyclocarbonate (meth)acrylate monomer is present in the ink in an amount of 10-50 wt. %, 15-50 wt. %, 15-35 wt. %, or 20-30 wt. %, based on the total weight of the ink.

As noted above, an ink described herein, in some cases, further comprises one or more additional curable materials differing from the oligomeric curable material and the cyclocarbonate (meth)acrylate monomer. In some instances, for example, the additional curable materials comprise an additional monomeric curable material and/or an additional oligomeric curable material, as described further hereinbelow.

Additionally, it is to be understood that the photoinitiator of an ink described herein is operable to initiate curing of the oligomeric curable material, the cyclocarbonate (meth)acrylate monomer, and the additional curable material(s) (if present), when the photoinitiator is exposed to incident curing radiation.

It is further to be understood that an ink described herein, in either the uncured state or the cured state, can have one or more structural properties that provide an advantage for use of the ink in additive manufacturing. For example, in some embodiments, the dynamic viscosity of an uncured ink described herein is greater than 100 cP at 25° C., when measured according to ASTM D2983. In some embodiments, the dynamic viscosity of an uncured ink described herein is greater than 100 cP and less than 5000 cP at 25° C., when measured according to ASTM D2983. Similarly, in other cases, an ink described herein, when cured, exhibits a volumetric polymerization shrinkage of no greater than 5% compared to the ink when uncured, wherein the volumetric polymerization shrinkage is measured according to ASTM D792. Further, in some instances, an ink, when cured, exhibits a notched Izod impact strength of 50 to 200 J/m when measured according to ASTM D256 and/or a tear strength of 20 to 200 kN/m when measured according to ASTM D624.

In another aspect, methods of forming a 3D article by additive manufacturing are described herein. In some embodiments, such a method comprises selectively depositing layers of an ink described herein in a fluid state onto a substrate to form the three-dimensional article. The method can further comprise photocuring the ink. Additionally, in some embodiments of a method described herein, the ink is selectively photocured according to preselected computer aided design (CAD) parameters.

Alternatively, in other embodiments, a method of forming a 3D article by additive manufacturing comprises retaining an ink described herein in a fluid state in a container, and selectively applying energy to the ink in the container to solidify at least a portion of a first fluid layer of the ink, thereby forming a first solidified layer that defines a first cross-section of the article. The method further comprises raising or lowering the first solidified layer to provide a second fluid layer of the ink at a surface of the fluid ink in the container, and selectively applying energy to the ink in the container to solidify at least a portion of the second fluid layer of the ink, thereby forming a second solidified layer that defines a second cross-section of the article, the first cross-section and the second cross-section being bonded to one another in a z-direction. As described further hereinbelow, the foregoing steps may be repeated any desired number of times needed to complete the 3D article. Moreover, in some preferred embodiments, selectively applying energy to the ink in the container comprises photocuring the ink. In addition, in some cases, a method of printing described herein has a print speed of 40-60 mm/min, such as 50 mm/min.

In still another aspect, printed 3D articles are described herein. Such an article can be formed from any ink and using any method described herein. Such printed 3D articles, in some cases, have superior accuracy and/or toughness (e.g., tear strength) compared to some other 3D articles, particularly when formed primarily from a poly(meth)acrylate polymer network.

These and other embodiments are described in greater detail in the detailed description which follows.

DETAILED DESCRIPTION

Embodiments described herein can be understood more readily by reference to the following detailed description and examples. Elements, apparatus and methods described herein, however, are not limited to the specific embodiments presented in the detailed description and examples. It should be recognized that these embodiments are merely illustrative of the principles of the present disclosure. Numerous modifications and adaptations will be readily apparent to those of skill in the art without departing from the spirit and scope of the disclosure.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9. Similarly, a stated range of "1 to 10" should be considered to include any and all subranges beginning with a minimum value of 1 or more and ending with a maximum value of 10 or less, e.g., 1 to 5, or 4 to 10, or 3 to 7, or 5 to 8.

All ranges disclosed herein are also to be considered to include the end points of the range, unless expressly stated otherwise. For example, a range of "between 5 and 10," "from 5 to 10," or "5-10" should generally be considered to include the end points 5 and 10.

Further, when the phrase "up to" is used in connection with an amount or quantity, it is to be understood that the amount is at least a detectable amount or quantity. For example, a material present in an amount "up to" a specified amount can be present from a detectable amount and up to and including the specified amount.

The terms "three-dimensional printing system," "three-dimensional printer," "printing," and the like generally describe various solid freeform fabrication techniques for making three-dimensional articles or objects by stereolithography, selective deposition, jetting, fused deposition modeling, multi-jet modeling, and other additive manufacturing techniques now known in the art or that may be known in the future that use a build material or ink to fabricate three-dimensional objects.

I. Inks for 3D Printing

In one aspect, inks for use with a 3D printer are described herein. In some embodiments, an ink described herein comprises 20-60 wt. % oligomeric curable material; 10-50 wt. % cyclocarbonate (meth)acrylate monomer; 0.1-5 wt. % photoinitiator; optionally one or more additional curable materials differing from the oligomeric curable material and the cyclocarbonate (meth)acrylate monomer; and optionally one or more additional component that are non-curable. For instance, in some cases, an ink described herein further comprises at least one colorant, at least one filler, at least one inhibitor, at least one stabilizing agent, or a combination of two or more of the foregoing. The foregoing weight percents are based on the total weight of the ink. Additionally, as understood by one of ordinary skill in the art, the total amount of the oligomeric curable material, cyclocarbonate (meth)acrylate monomer, photoinitiator, additional curable material (if present), and one or more additional non-curable components (if present) is equal to 100 wt. % for a given ink. Moreover, the photoinitiator is operable to initiate curing of the oligomeric curable material and/or the cyclocarbonate (meth)acrylate monomer and/or the additional curable material when the photoinitiator is exposed to incident curing radiation having a peak wavelength λ that is absorbed by the photoinitiator. That is, the photoinitiator is a photoinitiator of curing of the oligomeric curable material and/or the cyclocarbonate (meth)acrylate monomer and/or the additional curable material.

Notably, inks described herein generally comprise a cyclocarbonate (meth)acrylate monomer. The cyclocarbonate (meth)acrylate monomer has the structure of Formula (A1):

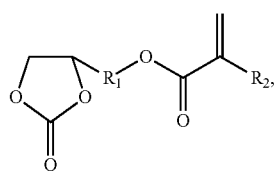

(A1)

wherein $R_1$ is selected from the group consisting of a linear or branched C1-C6 alkylene moiety, an alkylene-carbonate moiety, an alkylene-ester moiety, and an alkylene-amide moiety; and wherein $R_2$ is H or $CH_3$.

For reference purposes herein, it is to be understood that a "Cn-Cm alkylene moiety" (e.g., a "C1-C6 alkylene moiety") is a bivalent saturated aliphatic radical having from "n" to "m" carbon atoms (e.g., 1 to 6 carbon atoms, and no more than 6 carbon atoms). In some preferred embodiments, $R_1$ is a linear or branched C1-C4 alkylene moiety, such as $CH_2$, which is especially preferred. In some embodiments, an alkylene-carbonate moiety is a bivalent radical of the formula $.(CH2)_x-O-C(O)-O-(CH2)_y.$ wherein x and y are integers independently selected from 1 to 10. Moreover, an alkylene-ester moiety, in some embodiments, is a bivalent radical of the formula $.(CH2)_x-O-C(O)-O-(CH2)_y.$ wherein x and y are integers independently selected from 1 to 10. Further, an alkylene-amide moiety, in some embodiments, is a bivalent radical of the formula $.(CH2)_x-O-C(O)-O-(CH2)_y.$ wherein x and y are integers independently selected from 1 to 10.

Additionally, in some preferred embodiments, $R_2$ is H. In some especially preferred embodiments, $R_1$ is $CH_2$ and $R_2$ is H. Thus, in some cases, the cyclocarbonate (meth)acrylate monomer of an ink described herein has the structure of Formula (A2):

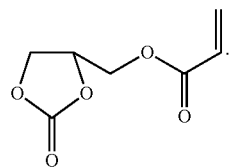

(A2)

In some embodiments, the cyclocarbonate (meth)acrylate monomer of an ink described herein has a structure selected from (A3) to (A5):

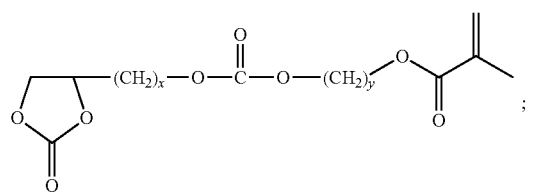

(A3)

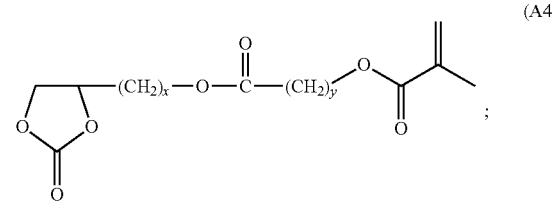

(A4)

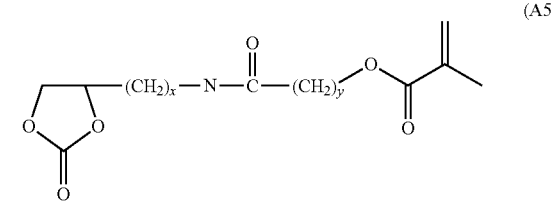

(A5)

Not intending to be bound by theory, it is believed that the reactivity of the cyclocarbonate (meth)acrylate having the structure of Formula (A2) provides preferred properties during additive manufacturing and in printed articles. In some embodiments, the cyclocarbonate (meth)acrylate can participate in crosslinking reactions between polymeric chains. For example, the cyclocarbonate (meth)acrylate can polymerize via the vinyl moiety and undergo crosslinking through hydrogen abstraction or other electron transfer process.

A cyclocarbonate (meth)acrylate monomer can be present in an ink described herein in any amount not inconsistent with the objectives of the present disclosure. In some embodiments, for instance, the cyclocarbonate (meth)acrylate monomer is present in the ink in an amount of 10-50 wt. % or, preferably, in an amount of 15-35 wt. % or 20-30 wt. %, based on the total weight of the ink. Again not intending to be bound by theory, it is believed that the use of such an amount of cyclocarbonate (meth)acrylate monomer provides improved performance (as described herein), compared to other amounts of cyclocarbonate (meth)acrylate monomer.

As described above, inks according to the present disclosure can offer various advantages over prior inks, particularly (meth)acrylate-containing inks. For example, inks described herein can be used to print articles with reduced or improved volumetric polymerization shrinkage. Inks described herein can also be used to print articles with improved accuracy and/or precision.

In some embodiments, for instance, an ink described herein, when cured, exhibits a volumetric polymerization shrinkage of no greater than 5% compared to the ink when uncured, wherein the volumetric polymerization shrinkage is measured according to ASTM D792, the percentage being based on the uncured ink value as the denominator. In some cases, an ink described herein, when cured, exhibits a volumetric polymerization shrinkage of no greater than 3% or no greater than 2% compared to the ink when uncured when the volumetric polymerization shrinkage is measured according to ASTM D792. In some instances, an ink described herein, when cured, exhibits a volumetric polymerization shrinkage of 0.5-5% or 1-3%, compared to the ink when uncured.

Additionally, inks described herein, in some cases, can be used to form articles having a poly(meth)acrylate network and also having improved impact strength and/or tear strength, when compared to other articles formed from other (meth)acrylate inks not according to the present invention. For example, in some embodiments, an ink described herein, when cured, exhibits a notched Izod impact strength of 50 to 200 J/m when measured according to ASTM D256 and/or a tear strength of 20 to 200 kN/m when measured according to ASTM D624. In some cases, an ink described herein, when cured, exhibits a notched Izod impact strength of 50 to 150 J/m, 50 to 100 J/m, or 100 to 200 J/m, when measured according to ASTM D256. Moreover, in some embodiments, an ink described herein, when cured, has a tear strength of 20 to 180 kN/m, 20 to 150 kN/m, 20 to 100 kN/m, 20 to 60 kN/m, 80 to 200 kN/m, 80 to 180 kN/m, 100 to 150 kN/m, or 150 to 200 kN/m, when measured according to ASTM D624.

Not intending to be bound by theory, it is believed that such properties as described above can be obtained by using an ink including 20-60 wt. % (or, preferably, 25-50 wt. %) oligomeric curable material, 10-50 wt. % (or, preferably, 15-35 wt. %) cyclocarbonate (meth)acrylate monomer, and 0.1-7 wt. % photoinitiator, based on the total weight of the ink. As described below, it is further to be understood that additional components (curable or non-curable) can be included in an ink described herein, and that such additional components can provide certain additional desired properties to the ink. Thus, as described herein, a wide variety of inks for various additive manufacturing applications can be provided according to the present disclosure, unified by the inventive concepts and technical effects described herein.

Further, inks described herein, in some embodiments, provide one or more of the foregoing advantages without sacrificing speed of the additive manufacturing process. Moreover, inks described herein can be used in a variety of different 3D printers or additive manufacturing systems, such as those based on SLA, DLP, and MJP. The ability to use inks described herein in SLA and/or DLP is especially to be noted. As discussed further herein, an ink described herein, in either the uncured state or the cured state, can have one or more structural properties that provide an advantage for use of the ink in additive manufacturing, such as additive manufacturing based on SLA or DLP. For example, in some embodiments, the dynamic viscosity of an uncured ink described herein is greater than 100 cP and less than 5000 cP at 25° C., when measured according to ASTM D2983.

Turning now to other specific components of inks described herein, inks described herein may comprise one or more oligomeric curable materials and, optionally, one or more additional curable materials different from the oligo-meric curable material and cyclocarbonate (meth)acrylate monomer of the ink. Such an additional curable material can itself be a monomeric curable material or an oligomeric curable material. In some embodiments, the one or more additional curable materials comprise one or more species of acrylate monomer and/or oligomer, including but not limited to acryloyl morpholine, monofunctional acrylates and/or polyfunctional acrylates. A curable material, for reference purposes herein, comprises a chemical species that includes one or more curable or polymerizable moieties. A "polymerizable moiety," for reference purposes herein, comprises a moiety that can be polymerized or cured to provide a printed 3D article or object. Such polymerizing or curing can be carried out in any manner not inconsistent with the objectives of the present disclosure. In some embodiments, for example, polymerizing or curing comprises irradiating a polymerizable or curable material with electromagnetic radiation having sufficient energy to initiate a polymerization or cross-linking reaction. For instance, in some cases, ultraviolet (UV) radiation can be used. Thus, in some instances, a polymerizable moiety comprises a photo-polymerizable or photo-curable moiety, such as a UV-polymerizable moiety. In some embodiments, a curable material described herein is photo-polymerizable or photo-curable at wavelengths ranging from about 300 nm to about 400 nm or from about 320 nm to about 380 nm. Alternatively, in other instances, a curable material is photo-polymerizable at visible wavelengths of the electromagnetic spectrum.

Moreover, a polymerization reaction, in some cases, comprises a free radical polymerization reaction, such as that between points of unsaturation, including points of ethyleneic unsaturation. Other polymerization reactions may also be used. As understood by one of ordinary skill in the art, a polymerization reaction used to polymerize or cure a curable material described herein can comprise a reaction of a plurality of "monomers" or chemical species having one or more functional groups or moieties that can react with one another to form one or more covalent bonds.

One non-limiting example of a polymerizable moiety of a curable material described herein is an ethyleneically unsaturated moiety, such as a vinyl moiety, allyl moiety, or (meth)acrylate moiety, where the term "(meth)acrylate" throughout this disclosure includes acrylate or methacrylate or a mixture or combination thereof.

"Oligomeric" species, which are contained in the oligomeric curable material described herein, are themselves polymers or oligomers and have a relatively high molecular weight or a relatively high viscosity. These species are also capable of undergoing additional polymerization, such as through one or more points of unsaturation described herein. A population of oligomeric species in the oligomeric curable material described herein can have varying molecular structures and/or formulas throughout the population (such as may be exhibited, for example, by a specified mass of a urethane acrylate having a non-unity molecular weight distribution, or by a specified mass of an ethoxylated polyethylene glycol having a distribution of ethylene glycol units and/or a distribution of ethoxy units within the population). The weight average molecular weight of an oligomeric curable material described herein is generally in the range from about 500 to 6,000. Additionally, in some cases, the oligomeric curable material of an ink described herein comprises one or more ethylenically unsaturated species having a dynamic viscosity of 1,000 to 250,000 cP at 50° C., when measured according to ASTM D2983. In some preferred embodiments, the oligomeric curable material comprises one or more ethylenically unsaturated species having a dynamic viscosity of 1,000 to 200,000 cP at 50° C., when measured according to ASTM D2983. Not intending to be bound by theory, it is believed that such a combination of molecular weight and viscosity contributes to the achievement of the inventive technical effects of inks described herein.

In contrast to an "oligomeric" species, "monomeric" species, which are contained in the optional monomeric curable material described herein, are not themselves a polymer or oligomer, and have a relatively low molecular weight or a relatively low viscosity. "Monomeric" species contained in a monomeric curable material can have a consistent or well-defined molecular structure and/or formula throughout the population (such as may be exhibited, for instance, by a specified mass of ethoxylated (4) bisphenol A diacrylate or a specific mass of the above-described curable monomer). Additionally, in some embodiments, a monomeric curable material as described herein has a viscosity of 500 centipoise (cP) or less at 25° C., when measured according to ASTM D2983, and/or a molecular weight of less than 500, less than 400, or less than 300.

Additionally, an oligomeric curable material and/or a monomeric curable material described herein can comprise a monofunctional, difunctional, trifunctional, tetrafunctional, pentafunctional, or higher functional curable species. A "monofunctional" curable species, for reference purposes herein, comprises a chemical species that includes one curable or polymerizable moiety. Similarly, a "difunctional" curable species comprises a chemical species that includes two curable or polymerizable moieties; a "trifunctional" curable species comprises a chemical species that includes three curable or polymerizable moieties; a "tetrafunctional" curable species comprises a chemical species that includes four curable or polymerizable moieties; and a "pentafunctional" curable species comprises a chemical species that includes five curable or polymerizable moieties. Thus, in some embodiments, a monofunctional curable material of an ink described herein comprises a mono(meth)acrylate, a difunctional curable material of an ink described herein comprises a di(meth)acrylate, a trifunctional curable material of an ink described herein comprises a tri(meth)acrylate, a tetrafunctional curable material of an ink described herein comprises a tetra(meth)acrylate, and a pentafunctional curable material of an ink described herein comprises a penta (meth)acrylate. Other monofunctional, difunctional, trifunctional, tetrafunctional, and pentafunctional curable materials may also be used.

Moreover, a monofunctional, difunctional, trifunctional, tetrafunctional, and pentafunctional curable material, in some cases, can comprise a relatively low molecular weight species, i.e., a monomeric species, or a relatively high molecular weight species, i.e., an oligomeric species.

In general, any oligomeric curable material or combination of oligomeric curable materials not inconsistent with the objectives of the present disclosure may be used in an ink described herein. In some cases, an oligomeric curable material comprises a polyester (meth)acrylate oligomer, a urethane (meth)acrylate oligomer, or an epoxy(meth)acrylate oligomer. Urethane (meth)acrylates are especially preferred in some cases. Further, in some embodiments, an oligomeric curable material described herein comprises an aliphatic polyester urethane acrylate oligomer and/or an acrylate amine oligomeric resin, such as EBECRYL 7100. In some cases, an oligomeric curable material described herein comprises a polypropylene glycol mono(meth)acrylate or polyethylene glycol mono(meth)acrylate. In some embodiments, an oligomeric curable material comprises a mono-functional aliphatic urethane (meth)acrylate. Moreover, in some cases, an oligomeric curable material comprises a diacrylate and/or dimethacrylate ester of an aliphatic, cycloaliphatic or aromatic diol, including polyethylene glycol, ethoxylated or propoxylated neopentyl glycol, ethoxylated or propoxylated bisphenol A, ethoxylated or propoxylated bisphenol F, ethoxylated or propoxylated bisphenol S, ethoxylated or propoxylated 1,1,1-trimethylolpropanetri (meth)acrylate, or ethoxylated or propoxylated glycerol tri (meth)acrylate. An oligomeric material may also comprise a cycloaliphatic epoxy.

Some non-limiting examples of commercially available oligomeric curable materials useful in some embodiments described herein include the following: alkoxylated tetrahydrofurfuryl acrylate, commercially available from SARTOMER under the trade name SR 611; monofunctional urethane acrylate, commercially available from RAHN USA under the trade name GENOMER 1122; an aliphatic urethane diacrylate, commercially available from ALLNEX under the trade name EBECRYL 8402; a multifunctional acrylate oligomer, commercially available from DYMAX Corporation under the trade name BR-952; and aliphatic polyether urethane acrylate, commercially available from DYMAX Corporation under the trade name BR-371S. Other commercially available oligomeric curable materials may also be used.

Urethane (meth)acrylates suitable for use in inks described herein, in some cases, can be prepared in a known manner, typically by reacting a hydroxyl-terminated urethane with acrylic acid or methacrylic acid to give the corresponding urethane (meth)acrylate, or by reacting an isocyanate-terminated prepolymer with hydroxyalkyl acrylates or methacrylates to give the urethane (meth)acrylate. Suitable processes are disclosed, inter alia, in EP-A 114 982 and EP-A 133 908. The weight average molecular weight of such (meth)acrylate oligomers, in some cases, can be from about 500 to 6,000. Urethane (meth)acrylates are also commercially available from SARTOMER under the product names CN980, CN981, CN975 and CN2901, or from BOMAR Specialties Co. under the product name BR-741, BR-771 F, BR 7432GB and BR751 MB.

The oligomeric curable material can be present in an ink described herein in any amount not inconsistent with the objectives of the present disclosure. In some cases, the oligomeric curable material, in total, is present in the ink in an amount of 20-60 wt. % or, preferably, 25-50 wt. %, based on the total weight of the ink.

In addition, any monomeric curable material or combination of monomeric curable materials not inconsistent with the objectives of the present disclosure may be used as an additional monomeric curable material component. In some cases, a monomeric curable material of an ink described herein comprises one or more species of (meth)acrylates, such as one or more monofunctional, difunctional, trifunctional, tetrafunctional (meth)acrylates, and/or pentafunctional (meth)acrylates. In some embodiments, for instance, a monomeric curable material comprises methyl (meth) acrylate, ethyl (meth)acrylate, n-propyl (meth)acrylate, n-butyl (meth)acrylate, isobutyl (meth)acrylate, n-hexyl (meth)acrylate, 2-ethylhexyl (meth)acrylate, n-octyl (meth) acrylate, n-decyl (meth)acrylate, n-dodecyl (meth)acrylate, 2-hydroxyethyl (meth)acrylate, 2- or 3-hydroxypropyl (meth)acrylate, 2-methoxyethyl (meth)acrylate, 2-ethoxyethyl (meth)acrylate, 2- or 3-ethoxypropyl (meth)acrylate, tetrahydrofurfuryl methacrylate, isobornyl (meth)acrylate, 2-(2-ethoxyethoxy)ethyl acrylate, cyclohexyl methacrylate, 2-phenoxyethyl acrylate, glycidyl acrylate, isodecyl acrylate, 2-phenoxyethyl (meth)acrylate, lauryl methacrylate, or a combination thereof. In some embodiments, a monomeric curable material comprises one or more of allyl acrylate, allyl methacrylate, triethylene glycol di(meth)acrylate, tricyclodecane dimethanol diacrylate, and cyclohexane dimethanol diacrylate. Additionally, in some cases, a monomeric curable material comprises diacrylate and/or dimethacrylate esters of aliphatic, cycloaliphatic or aromatic diols, including 1,3- or 1,4-butanediol, neopentyl glycol, 1,6-hexanediol, diethylene glycol, triethylene glycol, tetraethylene glycol, tripropylene glycol, 1,4-dihydroxymethylcyclohexane, 2,2-bis(4-hydroxycyclohexyl)propane or bis(4-hydroxycyclohexyl)methane, hydroquinone, 4,4'-dihydroxybiphenyl, bisphenol A, bisphenol F, or bisphenol S. A monomeric curable material described herein may also comprise 1,1-trimethylolpropane tri(meth)acrylate, pentaerythritol monohydroxy tri(meth)acrylate, dipentaerythritol monohydroxy penta(meth)acrylate, and/or bis(trimethylolpropane) tetra(meth)acrylate. Further, in some cases, a monomeric curable material can comprise an ethoxylated or propoxylated species, such as ethoxylated or propoxylated neopentyl glycol, ethoxylated or propoxylated bisphenol A, ethoxylated or propoxylated bisphenol F, ethoxylated or propoxylated bisphenol S, ethoxylated or propoxylated 1,1,1-trimethylolpropanetri(meth)acrylate, or ethoxylated or propoxylated glycerol tri(meth)acrylate. In some cases, a monomeric curable material comprises a cycloaliphatic epoxy.

Additional non-limiting examples of commercially available monomeric curable materials useful in some embodiments described herein include the following: isobornyl acrylate (IBOA), commercially available from SARTOMER under the trade name SR 506; isobornyl methacrylate, commercially available from SARTOMER under the trade name SR 423A; triethylene glycol diacrylate, commercially available from SARTOMER under the trade name SR 272; triethylene glycol dimethacrylate, commercially available from SARTOMER under the trade name SR 205; tricyclodecane dimethanol diacrylate, commercially available from SARTOMER under the trade name SR 833S; tris(2-hydroxy ethyl)isocyanurate triacrylate, commercially available from SARTOMER under the trade name SR 368; 2-phenoxyethyl acrylate, commercially available from SARTOMER under the trade name SR 339; ethyoxylated (3 mole) bisphenol A diacrylate, commercially available from SARTOMER under the trade name SR 349; a cyclic monofunctional acrylate, commercially available by RAHN USA Corp. under the trade name GENOMER 1120; and dipentaerythritol pentaacrylate, commercially available from SARTOMER under the trade name SR 399 LV. Other commercially available monomeric curable materials may also be used.

An additional monomeric curable material, when used, can be present in an ink described herein in any amount not inconsistent with the objectives of the present disclosure. In some cases, the additional monomeric curable material, in total, is present in an amount up to about 40 wt. %, up to about 30 wt. %, up to about 25 wt. %, or up to about 20 wt. %, based on the total weight of the ink. In some cases, an ink described herein comprises about 0-40 wt. %, 10-40 wt. %, or 15-35 wt. % additional monomeric curable material, based on the total weight of the ink. In some instances, an ink described herein does not include any additional monomeric curable material other than the cyclocarbonate (meth) acrylate monomer.

Inks described herein also comprise one or more photoinitiators. Any photoinitiator not inconsistent with the objectives of the present disclosure may be used in an ink described herein. In some embodiments, for example, the photoinitiator comprises an alpha-cleavage type (unimolecular decomposition process) photoinitiator or a hydrogen abstraction photosensitizer-tertiary amine synergist, operable to absorb light between about 250 nm and about 400 nm or between about 300 nm and about 385 nm, to yield free radical(s). Examples of alpha cleavage photoinitiators are Irgacure 184 (CAS 947-19-3), Irgacure 369 (CAS 119313-12-1), and Irgacure 819 (CAS 162881-26-7). An example of a photosensitizer-amine combination is Darocur BP (CAS 119-61-9) with diethylaminoethylmethacrylate.

In addition, in some instances, photoinitiators comprise benzoins, including benzoin, benzoin ethers, such as benzoin methyl ether, benzoin ethyl ether and benzoin isopropyl ether, benzoin phenyl ether and benzoin acetate, acetophenones, including acetophenone, 2,2-dimethoxyacetophenone and 1,1-dichloroacetophenone, benzil, benzil ketals, such as benzil dimethyl ketal and benzil diethyl ketal, anthraquinones, including 2-methylanthraquinone, 2-ethylanthraquinone, 2-tert-butylanthraquinone, 1-chloroanthraquinone and 2-amylanthraquinone, triphenylphosphine, benzoylphosphine oxides, such as 2,4,6-trimethylbenzoyldiphenylphosphine oxide (Lucirin TPO), benzophenones, such as benzophenone and 4,4'-bis(N,N'-dimethylamino) benzophenone, thioxanthones and xanthones, acridine derivatives, phenazine derivatives, quinoxaline derivatives or 1-phenyl-1,2-propanedione, 2-O-benzoyl oxime, 1-aminophenyl ketones or 1-hydroxyphenyl ketones, such as 1-hydroxycyclohexyl phenyl ketone, phenyl 1-hydroxyisopropyl ketone and 4-isopropylphenyl 1-hydroxyisopropyl ketone.

Photoinitiators can also comprise photoinitiators operable for use with a HeCd laser radiation source, including acetophenones, 2,2-dialkoxybenzophenones and 1-hydroxyphenyl ketones, such as 1-hydroxycyclohexyl phenyl ketone or 2-hydroxyisopropyl phenyl ketone (=2-hydroxy-2,2-dimethylacetophenone). Additionally, in some cases, photoinitiators comprise photoinitiators operable for use with an Ar laser radiation source including benzil ketals, such as benzil dimethyl ketal. In some embodiments, a suitable photoinitiator comprises an α-hydroxyphenyl ketone, benzil dimethyl ketal or 2,4,6-trimethylbenzoyldiphenylphosphine oxide or a mixture thereof.

Another class of photoinitiators that may be included in an ink described herein comprises ionic dye-counter ion compounds capable of absorbing actinic radiation and generating free radicals for polymerization initiation. Some ionic dye-counter ion compounds and their mode of operation are disclosed in EP-A-0 223 587 and U.S. Pat. Nos. 4,751,102; 4,772,530; and 4,772,541. A photoinitiator described herein may also be a cationic photoinitiator such as a triphenyl sulphonium photoinitiator.

A photoinitiator can be present in an ink described herein in any amount not inconsistent with the objectives of the present disclosure. In some embodiments, a photoinitiator is present in an ink in an amount of up to about 5 wt. %, up to about 4 wt. %, or up to about 3 wt. %, based on the total weight of the ink. In some cases, a photoinitiator is present in an amount of about 0.1-5 wt. %, 0.1-4 wt. %, 0.1-3.5 wt. %, 0.1-2 wt. %, 0.5-5 wt. %, 0.5-4 wt. %, 0.5-3.5 wt. %, 1-5 wt. %, 1-4 wt. %, 1-3.5 wt. %, 2-5 wt. %, or 2-4 wt. %.

It is further to be understood that the amounts (weight percents) described in the immediately preceding paragraph refer to photoinitiators that are non-oligomeric and non-polymeric. That is, the amounts described above refer to "monomeric" or "molecular" photoinitiators, which may, for instance, have a molecular weight of less than 400. However, it is also to be understood that oligomeric or polymeric photoinitiators may be used in inks and methods described herein. But in such an instance (when an oligomeric or polymeric photoinitiator is used), then the amounts (weight percents) above are to be calculated without taking into account the weight of the oligomeric or polymeric portion or moiety of the oligomeric or polymeric photoinitiator. In other words, to determine the overall amount (weight percent) of the oligomeric or polymeric photoinitiator that is present in the ink, the calculation (specifically, the numerator) should be based on only the molecular weight of the photoactive moiety of the photoinitiator, not on the molecular weight(s) of the remaining moieties or repeating units of the oligomeric or polymeric photoinitiator (for purposes of the present disclosure).

Turning to possible additional components of inks described herein, inks described herein can further comprise one or more photosensitizers. In general, such a sensitizer can be added to an ink to increase the effectiveness of one or more photoinitiators that may also be present. In some cases, a sensitizer comprises isopropylthioxanthone (ITX) or 2-chlorothioxanthone (CTX).

A sensitizer can be present in an ink in any amount not inconsistent with the objectives of the present disclosure. In some embodiments, a sensitizer is present in an amount ranging from about 0.1 wt. % to about 2 wt. % or from about 0.5 wt. % to about 1 wt. %, based on the total weight of the ink. However, in other cases, an ink described herein excludes a sensitizer such as described above.

Turning to another possible component of the ink described herein, inks described herein can also comprise at least one colorant. Such a colorant of an ink described herein can be a particulate colorant, such as a particulate pigment, or a molecular colorant, such as a molecular dye. Any such particulate or molecular colorant not inconsistent with the objectives of the present disclosure may be used. In some cases, for instance, the colorant of an ink comprises an inorganic pigment, such as $TiO_2$ and/or $ZnO$. In some embodiments, the colorant of an ink comprises a colorant for use in a RGB, sRGB, CMY, CMYK, L*a*b*, or Pantone® colorization scheme. Moreover, in some cases, a particulate colorant described herein has an average particle size of less than about 5 µm, or less than about 1 µm. In some instances, a particulate colorant described herein has an average particle size of less than about 500 nm, such as an average particle size of less than about 400 nm, less than about 300 nm, less than about 250 nm, less than about 200 nm, or less than about 150 nm. In some instances, a particulate colorant has an average particle size of about 50-5000 nm, about 50-1000 nm, or about 50-500 nm.

A colorant can be present in an ink described herein in any amount not inconsistent with the objectives of the present disclosure. In some cases, colorant is present in the ink in an amount up to about 2 wt. %, or an amount of about 0.005-2 wt. %, 0.01-2 wt. %, 0.01-1.5 wt. %, 0.01-1 wt. %, 0.01-0.5 wt. %, 0.1-2 wt. %, 0.1-1 wt. %, 0.1-0.5 wt. %, or 0.5-1.5 wt. %, based on the total weight of the ink.

Moreover, inks described herein, in some embodiments, further comprise one or more polymerization inhibitors and/or stabilizing agents. A polymerization inhibitor can be added to an ink to provide additional thermal stability to the composition. Any polymerization inhibitor not inconsistent with the present disclosure may be used. Moreover, a polymerization inhibitor can retard or decrease the rate of polymerization, and/or prevent polymerization from occurring for some period of time or "induction time" until the polymerization inhibitor is consumed. Further, in some cases, a polymerization inhibitor described herein is an "addition type" inhibitor. An inhibitor described herein can also be a "chain transfer type" inhibitor. In some instances, a suitable polymerization inhibitor comprises methoxyhydroquinone (MEHQ).

A stabilizing agent, in some embodiments, comprises one or more anti-oxidants. A stabilizing agent can comprise any anti-oxidant not inconsistent with the objectives of the present disclosure. In some cases, suitable anti-oxidants include various aryl compounds, including butylated hydroxytoluene (BHT), which can also be used as a polymerization inhibitor in some embodiments described herein. More generally, a single species may serve as both a stabilizing agent and a polymerization inhibitor. It is also possible, in some cases, to use a plurality of inhibitors and/or stabilizing agents, wherein differing inhibitors and/or stabilizers provide differing effects and/or work synergistically.

A polymerization inhibitor and/or a stabilizing agent can be present in an ink in any amount not inconsistent with the objectives of the present disclosure. In some embodiments, a polymerization inhibitor is present in an amount ranging from about 0.01 wt. % to about 2 wt. % or from about 0.05 wt. % to about 1 wt. %. Similarly, in some cases, a stabilizing agent is present in an ink in an amount ranging from about 0.1 wt. % to about 5 wt. %, from about 0.5 wt. % to about 4 wt. %, or from about 1 wt. % to about 3 wt. %, based on the total weight of the ink.

In some embodiments, an ink described herein may contain viscosity modifying agents. Non-limiting examples of viscosity modifying agents include a saturated fatty acid or a combination of saturated fatty acids, or an oil, such as a plant oil. The inks described herein may comprise up to 5 wt. % up to 3 wt. %, up to 1 wt. %, up to 0.5 wt. %, or up to 0.1 wt. % of a viscosity modifying agent not inconsistent with the objectives of the present disclosure.

An ink described herein may also include other so-called fillers. Such a filler, in general, can be non-curable, such that the filler does not participate chemically as a reactant in a polymerization used to form a polymer network during additive manufacturing. Such a filler can also be used to impart one or more desirable properties to the ink (such as color, mechanical strength, or electrical conductivity). Non-limiting examples of fillers include some of the possible additional components mentioned above (such as colorants) as well as inorganic fillers such as ceramic, metal, or other particles and/or organic fillers such as discrete polymer particles.

Inks described herein can exhibit a variety of desirable properties. Some desirable properties of inks have already been described above (e.g., low volumetric shrinkage). An ink can also exhibit other desirable properties. For example, an ink described herein can have any freezing point, melting point, and/or other phase transition temperature not inconsistent with the objectives of the present disclosure. In some cases, an ink has freezing and melting points consistent with temperatures used in some 3D printing systems, including 3D printing systems designed for use with phase changing inks. In some embodiments, the freezing point of an ink is greater than about 40° C. In some instances, for example, an ink has a freezing point centered at a temperature ranging from about 45° C. to about 55° C. or from about 50° C. to about 80° C. In some cases, an ink has a freezing point below about 40° C. or below about 30° C.

Further, in some embodiments described herein, an ink exhibits a sharp freezing point or other phase transition. In some cases, for instance, an ink freezes over a narrow range of temperatures, such as a range of about 1-10° C., about 1-8° C., or about 1-5° C. In some embodiments, an ink having a sharp freezing point freezes over a temperature range of X±2.5° C., where X is the temperature at which the freezing point is centered (e.g., X=65° C.).

In addition, an ink described herein, in some cases, is fluid at jetting temperatures encountered in some 3D printing systems. Moreover, in some embodiments, an ink solidifies once deposited on a surface during the fabrication of a three-dimensionally printed article or object. Alternatively, in other instances, an ink remains substantially fluid upon deposition on a surface. Solidification of an ink, in some embodiments, occurs through a phase change of the ink or a component of the ink. The phase change can comprise a liquid to solid phase change or a liquid to semi-solid phase change. Further, in some instances, solidification of an ink comprises an increase in viscosity of the ink, such as an increase in viscosity from a low viscosity state to a high viscosity state. Solidification of an ink can also occur due to curing of the ink.

Additionally, in some embodiments, the inks described herein, when non-cured, have a viscosity profile consistent with the requirements and parameters of one or more 3D printing systems, such as an MP or SLA system. For example, in some cases, an ink described herein has a dynamic viscosity at 30° C. of 1600 centipoise (cP) or less, 1200 cP or less, or 800 cP or less. In a preferred embodiment, an ink described herein has a dynamic viscosity of 500 cP or less at 30° C., when measured according to ASTM standard D2983 (e.g., using a Brookfield Model DV-II+ Viscometer). In some cases, an ink described herein when non-cured exhibits a dynamic viscosity of about 200-1600 cP, about 200-1200 cP, about 200-800 cP, about 200-500 cP, or about 200-400 cP at 30° C., when measured according to ASTM D2983. In other preferred embodiments, an ink described herein, when uncured, has a dynamic viscosity greater than 500 cP and less than 2500 cP at 50° C., when measured according to ASTM D2983.

Inks described herein can also exhibit a variety of desirable properties, in addition to those described hereinabove, in a cured state. An ink in a "cured" state, as used throughout the present disclosure, comprises an ink that includes a curable material or polymerizable component that has been at least partially cured, i.e., at least partially polymerized and/or cross-linked. For instance, in some cases, a cured ink is at least about 70% polymerized or cross-linked or at least about 80% polymerized or cross-linked. In some embodiments, a cured ink is at least about 85%, at least about 90%, at least about 95%, at least about 98%, or at least 99% polymerized or cross-linked. In some instances, a cured ink is between about 80% and about 99% polymerized or cross-linked.

In some cases, for example, an ink described herein, when cured, has an impact resistance (notched) as described above. Moreover, in some cases, an ink described herein, when cured, can exhibit a plurality of the properties described in the present disclosure.

Inks described herein can be produced in any manner not inconsistent with the objectives of the present disclosure. In some embodiments, for instance, a method for the preparation of an ink described herein comprises the steps of mixing the components of the ink, melting the mixture, and filtering the molten mixture. Melting the mixture, in some cases, is carried out at a temperature of about 75° C. or in a range from about 75° C. to about 85° C. In some embodiments, an ink described herein is produced by placing all components of the ink in a reaction vessel and heating the resulting mixture to a temperature ranging from about 75° C. to about 85° C. with stirring. The heating and stirring are continued until the mixture attains a substantially homogenized molten state. In general, the molten mixture can be filtered while in a flowable state to remove any large undesirable particles that may interfere with jetting or extrusion or other printing process. The filtered mixture can then be cooled to ambient temperatures and stored until ready for use in a 3D printing system.

II. Methods of Forming a 3D Article

In another aspect, methods of forming or "printing" a 3D article or object by additive manufacturing are described herein. Methods of forming a 3D article or object described herein can include forming the 3D article from a plurality of layers of an ink described herein in a layer-by-layer manner (such as in MJP or SLA printing methods). For example, in some instances, an MP method of printing a 3D article comprises selectively depositing layers of an ink described herein in a fluid state onto a substrate, such as a build pad of a 3D printing system. The method can further comprise further curing (e.g., photocuring) the ink. Moreover, curing can comprise polymerizing one or more polymerizable moieties or functional groups of one or more components of the ink. In some cases, a layer of deposited ink is cured prior to the deposition of another or adjacent layer of ink. Additionally, curing one or more layers of deposited ink, in some embodiments, is carried out by exposing the one or more layers to electromagnetic radiation, such as UV light, visible light, or infrared light, as described above. In addition, in some embodiments, such a method further comprises supporting at least one of the layers of the ink with a support material, before or after curing. Any support material not inconsistent with the objectives of the present disclosure may be used, as described further below.

Alternatively, a method of printing a 3D article comprises retaining an ink in a fluid state in a container; selectively applying energy to the ink in the container to solidify at least a portion of a first fluid layer of the ink, thereby forming a first solidified layer that defines a first cross-section of the article; raising or lowering the first solidified layer to provide a second fluid layer of the ink at a surface of the fluid ink in the container; and selectively applying energy to the ink in the container to solidify at least a portion of the second fluid layer of the ink, thereby forming a second solidified layer that defines a second cross-section of the article, the first cross-section and the second cross-section being bonded to one another in a z-direction. Moreover, in some such embodiments, selectively applying energy to the ink in the container comprises photocuring the ink. Further, such a method can be carried out a relatively high printing speed, even for the formation of a relatively large 3D article. For example, in some cases, a method of printing described herein has a print speed of 20-60 mm/hr, such as 50 mm/hr.

Further, in some embodiments of methods described herein, one or more layers of an ink described herein has a thickness of about 10 μm to about 100 μm, about 10 μm to about 80 μm, about 10 μm to about 50 μm, about 20 μm to about 100 μm, about 20 μm to about 80 μm, or about 20 μm to about 40 μm. Other thicknesses are also possible.

Methods of forming a 3D article by additive manufacturing can also include forming the object in a manner other than a layer-by-layer manner.

Additionally, any ink described hereinabove in Section I may be used in a method described herein. For example, in some cases, a method described herein comprises 20-60 wt. % oligomeric curable material; 10-50 wt. % cyclocarbonate (meth)acrylate monomer; 0.1-5 wt. % photoinitiator; optionally up to 40 wt. % one or more additional curable materials differing from the oligomeric curable material and the cyclocarbonate (meth)acrylate monomer; and optionally up to 10 wt. % one or more additional component that are non-curable, wherein the weight percentages are based on the total weight of the ink, and wherein the total amount of all of the foregoing components combined is 100 wt. %.

Further details regarding various methods, including "material deposition" methods (such as MJP) or "vat polymerization" methods (such as SLA), are provided below.

A. Material Deposition Methods

In a material deposition method, one or more layers of an ink described herein are selectively deposited onto a substrate and cured. Curing of the ink may occur after selective deposition of one layer, each layer, several layers, or all layers of the ink.

In some instances, an ink described herein is selectively deposited in a fluid state onto a substrate, such as a build pad of a 3D printing system. Selective deposition may include, for example, depositing the ink according to preselected CAD parameters. For example, in some embodiments, a CAD file drawing corresponding to a desired 3D article to be printed is generated and sliced into a sufficient number of horizontal slices. Then, the ink is selectively deposited, layer by layer, according to the horizontal slices of the CAD file drawing to print the desired 3D article. A "sufficient" number of horizontal slices is the number necessary for successful printing of the desired 3D article, e.g., to produce it accurately and precisely.

Further, in some embodiments, a preselected amount of ink described herein is heated to the appropriate temperature and jetted through a print head or a plurality of print heads of a suitable inkjet printer to form a layer on a print pad in a print chamber. In some cases, each layer of ink is deposited according to preselected CAD parameters. A suitable print head to deposit the ink, in some embodiments, is a piezoelectric print head. Additional suitable print heads for the deposition of ink and support material described herein are commercially available from a variety of ink jet printing apparatus manufacturers. For example, Xerox, Hewlett Packard, or Ricoh print heads may be used in some instances.

Additionally, in some embodiments, an ink described herein remains substantially fluid upon deposition. Alternatively, in other instances, the ink exhibits a phase change upon deposition and/or solidifies upon deposition. Moreover, in some cases, the temperature of the printing environment can be controlled so that the jetted droplets of ink solidify on contact with the receiving surface. In other embodiments, the jetted droplets of ink do not solidify on contact with the receiving surface, remaining in a substantially fluid state. Additionally, in some instances, after each layer is deposited, the deposited material is planarized and cured with electromagnetic (e.g., UV, visible, or infrared light) radiation prior to the deposition of the next layer. Optionally, several layers can be deposited before planarization and curing, or multiple layers can be deposited and cured followed by one or more layers being deposited and then planarized without curing. Planarization corrects the thickness of one or more layers prior to curing the material by evening the dispensed material to remove excess material and create a uniformly smooth exposed or flat up-facing surface on the support platform of the printer. In some embodiments, planarization is accomplished with a wiper device, such as a roller, which may be counter-rotating in one or more printing directions but not counter-rotating in one or more other printing directions. In some cases, the wiper device comprises a roller and a wiper that removes excess material from the roller. Further, in some instances, the wiper device is heated. It should be noted that the consistency of the jetted ink described herein prior to curing, in some embodiments, should desirably be sufficient to retain its shape and not be subject to excessive viscous drag from the planarizer.

Moreover, a support material, when used, can be deposited in a manner consistent with that described hereinabove for the ink. The support material, for example, can be deposited according to the preselected CAD parameters such that the support material is adjacent or continuous with one or more layers of the ink. Jetted droplets of the support material, in some embodiments, solidify or freeze on contact with the receiving surface. In some cases, the deposited support material is also subjected to planarization, curing, or planarization and curing. Any support material not inconsistent with the objectives of the present disclosure may be used.

Layered deposition of the ink and support material can be repeated until the 3D article has been formed. In some embodiments, a method of printing a 3D article further comprises removing the support material from the ink.

Curing of the ink may occur after selective deposition of one layer of ink, of each layer of ink, of several layers of ink, or of all layers of the ink necessary to print the desired 3D article. In some embodiments, a partial curing of the deposited ink is performed after selective deposition of one layer of ink, each layer of ink, several layers of ink, or all layers of the ink necessary to print the desired 3D article. A "partially cured" ink, for reference purposes herein, is one that can undergo further curing. For example, a partially cured ink is up to about 30% polymerized or cross-linked or up to about 50% polymerized or cross-linked. In some embodiments, a partially cured ink is up to about 60%, up to about 70%, up to about 80%, up to about 90%, or up to about 95% polymerized or cross-linked.

Partial curing of the deposited ink can include irradiating the ink with an electromagnetic radiation source or photo-curing the ink (including with curing radiation described hereinabove). Any electromagnetic radiation source not inconsistent with the objectives of the present disclosure may be used, e.g., an electromagnetic radiation source that emits UV, visible or infrared light. For example, in some embodiments, the electromagnetic radiation source can be one that emits light having a wavelength from about 300 nm to about 900 nm, e.g., a Xe arc lamp.

Further, in some embodiments, a post-curing is performed after partially curing is performed. For example, in some cases, post-curing is carried out after selectively depositing all layers of the ink necessary to form a desired 3D article, after partially curing all layers of the ink, or after both of the foregoing steps have been performed. Moreover, in some embodiments, post-curing comprises photocuring. Again, any electromagnetic radiation source not inconsistent with the objectives of the present disclosure may be used for a post-curing step described herein. For example, in some embodiments, the electromagnetic radiation source can be a light source that has a higher energy, a lower energy, or the same energy as the electromagnetic radiation source used for partial curing. In some cases wherein the electromagnetic radiation source used for post-curing has a higher energy (i.e., a shorter wavelength) than that used for partial curing, a Xe arc lamp can be used for partial curing and a Hg lamp can be used for post-curing.

Additionally, after post-curing, in some cases, the deposited layers of ink are at least about 80% polymerized or cross-linked or at least about 85% polymerized or cross-linked. In some embodiments, the deposited layers of ink are at least about 90%, at least about 95%, at least about 98%, or at least about 99% polymerized or cross-linked. In some instances, the deposited layers of ink are about 80-100%, about 80-99%, about 80-95%, about 85-100%, about 85-99%, about 85-95%, about 90-100%, or about 90-99% polymerized or cross-linked.

B. Vat Polymerization Methods

It is also possible to form a 3D article from an ink described herein using a vat polymerization method, such as an SLA method. Thus, in some cases, a method of printing a 3D article described herein comprises retaining an ink described herein in a fluid state in a container and selectively applying energy (particularly, for instance, curing radiation) to the ink in the container to solidify at least a portion of a fluid layer of the ink, thereby forming a solidified layer that defines a cross-section of the 3D article. Additionally, a method described herein can further comprise raising or lowering the solidified layer of ink to provide a new or second fluid layer of unsolidified ink at the surface of the fluid ink in the container, followed by again selectively applying energy (e.g., the curing radiation) to the ink in the container to solidify at least a portion of the new or second fluid layer of the ink to form a second solidified layer that defines a second cross-section of the 3D article. Further, the first and second cross-sections of the 3D article can be bonded or adhered to one another in the z-direction (or build direction corresponding to the direction of raising or lowering recited above) by the application of the energy for solidifying the ink. Moreover, in some instances, the electromagnetic radiation has an average wavelength of 300-900 nm, and in other embodiments the electromagnetic radiation has an average wavelength that is less than 300 nm. In some cases, the curing radiation is provided by a computer controlled laser beam. In addition, in some cases, raising or lowering a solidified layer of ink is carried out using an elevator platform disposed in the container of fluid ink. A method described herein can also comprise planarizing a new layer of fluid ink provided by raising or lowering an elevator platform. Such planarization can be carried out, in some cases, by a wiper or roller.

It is further to be understood that the foregoing process can be repeated a desired number of times to provide the 3D article. For example, in some cases, this process can be repeated "n" number of times, wherein n can be up to about 100,000, up to about 50,000, up to about 10,000, up to about 5000, up to about 1000, or up to about 500. Thus, in some embodiments, a method of printing a 3D article described herein can comprise selectively applying energy (e.g., curing radiation) to an ink in a container to solidify at least a portion of an nth fluid layer of the ink, thereby forming an nth solidified layer that defines an nth cross-section of the 3D article, raising or lowering the nth solidified layer of ink to provide an (n+1)th layer of unsolidified ink at the surface of the fluid ink in the container, selectively applying energy to the (n+1)th layer of ink in the container to solidify at least a portion of the (n+1)th layer of the ink to form an (n+1)th solidified layer that defines an (n+1)th cross-section of the 3D article, raising or lowering the (n+1)th solidified layer of ink to provide an (n+2)th layer of unsolidified ink at the surface of the fluid ink in the container, and continuing to repeat the foregoing steps to form the 3D article. Further, it is to be understood that one or more steps of a method described herein, such as a step of selectively applying energy (e.g., curing radiation) to a layer of ink, can be carried out according to an image of the 3D article in a computer-readable format. General methods of 3D printing using stereolithography are further described, inter alia, in U.S. Pat. Nos. 5,904,889 and 6,558,606.

Performing a printing process described above can provide a printed 3D article from an ink described herein that has a high feature resolution. The "feature resolution" of an article, for reference purposes herein, can be the smallest controllable physical feature size of the article. The feature resolution of an article can be described in terms of a unit of distance such as microns ($\mu$m), or in terms of dots per inch (dpi). As understood by one of ordinary skill in the art, a higher feature resolution corresponds to a higher dpi value but a lower distance value in $\mu$m. In some cases, an article formed by depositing or solidifying an ink described herein can have a feature resolution of about 500 $\mu$m or less, about 200 $\mu$m or less, about 100 $\mu$m or less, or about 50 $\mu$m or less, including at elevated temperatures. In some embodiments, an article has a feature resolution between about 50 $\mu$m and about 500 $\mu$m, between about 50 $\mu$m and about 200 $\mu$m, between about 50 $\mu$m and about 100 $\mu$m, or between about 100 $\mu$m and about 200 $\mu$m. Correspondingly, in some instances, an article described herein has a feature resolution of at least about 100 dpi, at least about 200 dpi, at least about 250 dpi, at least about 400 dpi, or at least about 500 dpi. In some cases, the feature resolution of an article is between about 100 dpi and about 600 dpi, between about 100 dpi and about 250 dpi, or between about 200 dpi and about 600 dpi.

In a vat polymerization method such as described above, the ink may be partially cured as described in Section IIA above. For example, in some embodiments, selectively applying energy to the ink in the container to solidify at least a portion of a fluid layer of the ink may include partially curing at least a portion of a fluid layer of the ink. In other embodiments, partial curing of at least a portion of a fluid layer of the ink may occur after a first layer of the ink is provided and solidified, before or after a second layer of the ink is provided or solidified, or before or after one, several, or all subsequent layers of the ink are provided or solidified.

Additionally, in some embodiments of a vat polymerization method described herein, after partial curing or after the desired 3D article is formed, post-curing as described in Section IIA above may be performed. The desired 3D article may be, for example, an article that corresponds to the design in a CAD file.

III. Printed 3D Articles

In another aspect, printed 3D articles are described herein. In some embodiments, a printed 3D article is formed from an ink described herein. Any ink described hereinabove in Section I may be used. For example, in some cases, the ink comprises 20-60 wt. % oligomeric curable material; 10-40 wt. % cyclocarbonate (meth)acrylate monomer; 0.1-5 wt. % photoinitiator; optionally up to 40 wt. % one or more additional curable materials differing from the oligomeric curable material and the cyclocarbonate (meth)acrylate monomer; and optionally up to 10 wt. % one or more additional component that are non-curable, wherein the weight percentages are based on the total weight of the ink, and wherein the total amount of all of the foregoing components combined is 100 wt. %. Further, in some cases, a printed 3D article described herein is formed primarily from a poly(meth)acrylate polymer network.

Some embodiments of inks for 3D printing are also further illustrated in the following non-limiting Examples.

EXAMPLE 1

Method of Preparing Inks

Inks according to some embodiments described herein were prepared as follows. Specifically, to prepare various inks, the components in the following Tables I-IV were mixed in a reaction vessel to form specific inks, as identified in the Tables. The amounts of various components in Tables I-IV refer to the wt. % of each component of the identified ink, based on the total weight of the ink. For each ink, the appropriate mixture was heated to a temperature of about 75-85° C. with stirring. The heating and stirring were continued until the mixture attained a substantially homogenized molten state. The molten mixture was then filtered. Next, the filtered mixture was allowed to cool to ambient temperature. Values of some measured properties are also provided in the Tables below. The units for measured values are as follows. For volumetric polymerization shrinkage: %. For notched Izod impact strength: J/m. For tear strength: kN/m. In Tables I-IV, dashes (--) indicate that the component was absent or the value is not reported here. However, to be clear, all of Inks 1-14 are "according to the present invention" as broadly described herein. Additionally, Inks 1-14 are particularly preferred embodiments of the present invention.

EXAMPLE 2

Variations in Amounts of Oligomeric Curable Material and Additional Curable Material Inks 1-3 in Table I were prepared according to the procedure in Example 1. The amount of the oligomeric curable material was varied from 40 to 50 wt. %, while the amounts of cyclocarbonate(meth)acrylate monomer and photoinitiator remained constant. The balance of the inks was formed primarily from additional curable materials differing from the oligomeric curable material and the cyclocarbonate (meth)acrylate monomer. The amount of additional curable material varied from 27 to 37 wt. %. The oligomeric curable material in each of Inks 1-3 was a mixture of aliphatic polyester urethane acrylate, aliphatic urethane diacrylate, and aliphatic urethane triacrylate in approximately equal amounts. The cyclocarbonate (meth) acrylate in each of Inks 1-3 was a monomer having the structure of Formula (A2). The additional curable material in Inks 1-3 was a combination of 2-pheoxyethyl acrylate, acryloyl morpholine, (5-ethyl-1,3-dioxan-5-yl)methyl acrylate, trimethylene glycol dimethacrylate (TEGDMA), and trimethyl cyclohexyl acrylate. The photoinitiator was Irgacure 819.

TABLE I

Ink Compositions.

| | Ink 1 | Ink 2 | Ink 3 |
|---|---|---|---|
| Oligomeric Curable Material | 40 | 45 | 50 |
| Cyclocarbonate (meth)acrylate Monomer | 20 | 20 | 20 |
| Additional Curable Material | 37 | 32 | 27 |
| Photoinitiator | 3 | 3 | 3 |
| Volumetric polymerization shrinkage | — | — | — |
| Notched Izod Impact Strength | — | 77 | 45 |
| Tear Strength | — | 185 | — |

EXAMPLE 3

Variation of Oligomeric Curable Material Species

Inks 4-6 in Table II were prepared according to the procedure in Example 1. In Inks 4-6, the amounts of the oligomeric curable material, cyclocarbonate (meth)acrylate monomer, photoinitiator, and additional curable material remained substantially constant. Additionally, the chemical identities of the cyclocarbonate (meth)acrylate monomer and photoinitiator remained the same. The types of monomeric curable material also remained the same in Inks 4-6. Specifically, the cyclocarbonate (meth)acrylate was a monomer having the structure of Formula (A2). The photoinitiator was Irgacure 819. The additional curable material was a combination of two or more of 2-pheoxyethyl acrylate, acryloyl morpholine, (5-ethyl-1,3-dioxan-5-yl)methyl acrylate, trimethylene glycol dimethacrylate (TEGDMA), and trimethyl cyclohexyl acrylate.

However, the type or species of oligomeric curable material was different for each of Inks 4-6. In particular, the oligomeric curable materials were as follows. Ink 4: a 15:15:20 mixture (by weight) of, respectively, aliphatic polyester urethane diacrylate having a $T_g$ of −60° C. and a dynamic viscosity of 200,000 cP at 50° C.; polyester urethane acrylate having a $T_g$ of 79° C. and a dynamic viscosity of 150,000 cP at 50° C.; and aliphatic urethane diacrylate having a $T_g$ of 32° C. and a dynamic viscosity of about 24,000 cP at 50° C. Ink 5: a 15:35 mixture (by weight) of, respectively, aliphatic polyester urethane diacrylate having a $T_g$ of −60° C. and a dynamic viscosity of 200,000 cP at 50° C.; and polyether urethane methacrylate having a $T_g$ of 75° C. and a dynamic viscosity of about 6,800 cP at 60° C. Ink 6: only polyether urethane methacrylate having a $T_g$ of 75° C. and a dynamic viscosity of about 6,800 cP at 60° C.

TABLE II

Ink Compositions.

| | Ink 4 | Ink 5 | Ink 6 |
|---|---|---|---|
| Oligomeric Curable Material | 50 | 50 | 50 |
| Cyclocarbonate (meth)acrylate Monomer | 20 | 20 | 20 |
| Additional Curable Material | 27 | 27 | 27 |
| Photoinitiator | 3 | 3 | 3 |
| Volumetric polymerization shrinkage | — | — | — |
| Notched Izod Impact Strength | 71 | >153 | 104 |
| Tear Strength | — | — | 120 |

EXAMPLE 4

Variation of Additional Curable Material Species

Inks 7-9 in Table II were prepared according to the procedure in Example 1. In Inks 7-9, the amounts of the oligomeric curable material, cyclocarbonate (meth)acrylate monomer, photoinitiator, and additional curable material remained substantially constant. Moreover, the chemical identities of the oligomeric curable material, cyclocarbonate (meth)acrylate monomer, and photoinitiator remained the same. Specifically, the oligomeric curable material was a 15:15 mixture (by weight) of aliphatic polyester urethane diacrylate having a $T_g$ of −60° C. and a dynamic viscosity of 200,000 cP at 50° C.; and polyester urethane acrylate having a $T_g$ of 79° C. and a dynamic viscosity of 150,000 cP at 50° C. The cyclocarbonate (meth)acrylate was a monomer having the structure of Formula (A2). The photoinitiator was Igacure 819.

However, the type or species of additional curable material was different for each of Inks 7-9. In particular, the additional curable materials were as follows. Ink 7: a 5:27 mixture (by weight) of, respectively, 2-phenoxyethyl acrylate and (5-ethyl-1,3-dioxan-5-yl)methyl acrylate. Ink 8: a 5:27 mixture (by weight) of, respectively, isobornyl acrylate and (5-ethyl-1,3-dioxan-5-yl)methyl acrylate. Ink 9: a 5:5: 22 mixture (by weight) of, respectively, 2-phenoxyethyl acrylate, isobornyl acrylate, and (5-ethyl-1,3-dioxan-5-yl) methyl acrylate.

TABLE III

Ink Compositions.

|  | Ink 7 | Ink 8 | Ink 9 |
|---|---|---|---|
| Oligomeric Curable Material | 45 | 45 | 45 |
| Cyclocarbonate (meth)acrylate Monomer | 20 | 20 | 20 |
| Additional Curable Material | 32 | 32 | 32 |
| Photoinitiator | 3 | 3 | 3 |
| Volumetric polymerization shrinkage | — | — | — |
| Notched Izod Impact Strength | 77 | 52 | 70 |
| Tear Strength | 185 | — | — |

EXAMPLE 5

Variations in Amount of Cyclocarbonate (Meth)acrylate Monomer

Inks 10-14 were prepared according to the procedure in Example 1. In Table IV, the amount of cyclocarbonate (meth)acrylate monomer varied from 15 to 35 wt. %, while the chemical identity of this monomer remained the same (corresponding to the structure of Formula (A2)). Moreover, the amounts of oligomeric curable material, additional curable material, and photoinitiator remained within ranges described herein.

The oligomeric curable material in Ink 10 was a mixture of aliphatic polyester urethane acrylate, aliphatic urethane diacrylate, and aliphatic urethane triacrylate. In Ink 11, the oligomeric curable material was a mixture of aliphatic urethane diacrylate, aliphatic urethane triacrylate, and polyester urethane acrylate. In Ink 12, it was a mixture of aliphatic polyester urethane acrylate, aliphatic urethane diacrylate, and aliphatic urethane triacrylate in approximately equal amounts. The oligomeric curable material for Inks 13 and 14 was polyester urethane acrylate.

The additional curable material in Inks 10-14 was a combination of 2-pheoxyethyl acrylate, acryloyl morpholine, (5-ethyl-1,3-dioxan-5-yl)methyl acrylate, trimethylene glycol dimethacrylate (TEGDMA), and trimethyl cyclohexyl acrylate. The photoinitiator was Irgacure 819.

TABLE IV

Ink Compositions.

|  | Ink 10 | Ink 11 | Ink 12 | Ink 13 | Ink 14 |
|---|---|---|---|---|---|
| Oligomeric Curable Material | 49 | 49 | 45 | 50 | 42 |
| Cyclocarbonate (meth)acrylate Monomer | 15 | 20 | 25 | 30 | 35 |
| Additional Curable Material | 33 | 28 | 27 | 17 | 19.5 |
| Photoinitiator | 3 | 3 | 3 | 3 | 3.5 |
| Volumetric polymerization shrinkage | — | — | — | — | — |
| Notched Izod Impact Strength | 38 | 33 | 68 | 60 | — |
| Tear Strength | — | — | — | 93 | — |

As demonstrated by the data above, it is to be understood that inks described and claimed herein are not limited to only the exact embodiments of Inks 1-14. Instead, based on the teachings of the present disclosure, other specific inks can be formulated by those of ordinary skill in the art.

Some additional, non-limiting example embodiments are provided below.

Embodiment 1. An ink for use in a three-dimensional printing system, the ink comprising:

20-60 wt. % oligomeric curable material;

15-50 wt. % cyclocarbonate (meth)acrylate monomer; and 0.1-5 wt. % photoinitiator, based on the total weight of the ink, wherein the oligomeric curable material comprises one or more ethylenically unsaturated species having a molecular weight of 500-6,000;

wherein the cyclocarbonate (meth)acrylate monomer has the structure of Formula (A1):

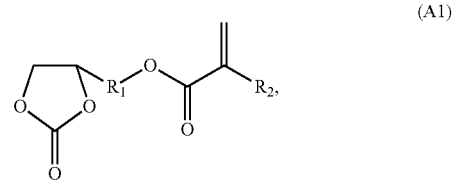

(A1)

wherein $R_1$ is selected from the group consisting of a linear or branched C1-C6 alkylene moiety, an alkylene-carbonate moiety, an alkylene-ester moiety, and an alkylene-amide moiety ; and wherein $R_2$ is H or $CH_3$.

Embodiment 2. The ink of Embodiment 1, wherein the oligomeric curable material comprises one or more ethylenically unsaturated species having a dynamic viscosity of 125,000 to 250,000 cP at 50° C., when measured according to ASTM D2983.

Embodiment 3. The ink of Embodiment 2, wherein the oligomeric curable material comprises one or more ethylenically unsaturated species having a dynamic viscosity of 150,000 to 200,000 cP at 50° C., when measured according to ASTM D2983.

Embodiment 4. The ink of any of the preceding Embodiments, wherein the oligomeric curable material comprises one or more aliphatic urethane (meth)acrylates.

Embodiment 5. The ink of any of the preceding Embodiments, wherein the oligomeric curable material is present in the ink in an amount of 25-50 wt. %, based on the total weight of the ink.

Embodiment 6. The ink of any of the preceding Embodiments, wherein $R_1$ is a linear or branched C1-C4 alkylene moiety.

Embodiment 7. The ink of any of the preceding Embodiments, wherein $R_2$ is H.

Embodiment 8. The ink of any of the preceding Embodiments, wherein $R_1$ is $CH_2$ and $R_2$ is H.

Embodiment 9. The ink of any of the preceding Embodiments, wherein the cyclocarbonate (meth)acrylate monomer is present in the ink in an amount of 20-30 wt. %, based on the total weight of the ink.

Embodiment 10. The ink of any of the preceding Embodiments, wherein the ink further comprises one or more additional curable materials differing from the oligomeric curable material and the cyclocarbonate (meth)acrylate monomer.

Embodiment 11. The ink of Embodiment 10, wherein the additional curable materials comprise an additional monomeric curable material.

Embodiment 12. The ink of Embodiment 10, wherein the additional curable materials comprise an additional oligomeric curable material.

Embodiment 13. The ink of any of the preceding Embodiments, wherein the ink further comprises at least one colorant.

Embodiment 14. The ink of any of the preceding Embodiments, wherein the ink further comprises at least one filler.

Embodiment 15. The ink of any of the preceding Embodiments, wherein the ink further comprises at least one inhibitor, at least one stabilizing agent, or a combination thereof.

Embodiment 16. The ink of any of the preceding Embodiments, wherein the dynamic viscosity of the uncured ink is greater than 100 cP at 50° C., when measured according to ASTM D2983.

Embodiment 17. The ink of Embodiment 16, wherein the dynamic viscosity of the uncured ink is greater than 100 cP and less than 5000 cP at 50° C., when measured according to ASTM D2983.

Embodiment 18. The ink of any of the preceding Embodiments, wherein the ink, when cured, exhibits a volumetric polymerization shrinkage of no greater than 5% compared to the ink when uncured, wherein the volumetric polymerization shrinkage is measured according to ASTM D792.

Embodiment 19. The ink of any of the preceding Embodiments, wherein the ink, when cured, exhibits a notched Izod impact strength of 50 to 200 J/m when measured according to ASTM D256.

Embodiment 20. The ink of any of the preceding Embodiments, wherein the ink, when cured, exhibits a tear strength of 20 to 200 kN/m when measured according to ASTM D624.

Embodiment 21. A method of printing a three-dimensional article comprising:

selectively depositing layers of an ink in a fluid state onto a substrate to form the three-dimensional article, wherein the ink comprises the ink of any of Embodiments 1-20.

Embodiment 22. The method of Embodiment 21 further comprising photocuring the ink.

Embodiment 23. A method of printing a three-dimensional article comprising:

retaining an ink in a fluid state in a container;

selectively applying energy to the ink in the container to solidify at least a portion of a first fluid layer of the ink, thereby forming a first solidified layer that defines a first cross-section of the article;

raising or lowering the first solidified layer to provide a second fluid layer of the ink at a surface of the fluid ink in the container; and selectively applying energy to the ink in the container to solidify at least a portion of the second fluid layer of the ink, thereby forming a second solidified layer that defines a second cross-section of the article, the first cross-section and the second cross-section being bonded to one another in a z-direction, wherein the ink comprises the ink of any of Embodiments 1-20.

Embodiment 24. The method of Embodiment 23, wherein selectively applying energy to the ink in the container comprises photocuring the ink.

Embodiment 25. The method of Embodiment 23, wherein the method of printing has a print speed of 20-60 or 45-55 mm/hr.

Embodiment 26. A printed three-dimensional article formed from the ink of any of Embodiments 1-20.

All patent documents referred to herein are incorporated by reference in their entireties. Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. An ink for use in three-dimensional printing, the ink comprising:

20-60 wt. % oligomeric curable material;

15-50 wt. % cyclocarbonate (meth)acrylate monomer; and 0.1-5 wt. % photoinitiator, based on the total weight of the ink, wherein the oligomeric curable material comprises one or more ethylenically unsaturated species having a weight average molecular weight of 500-6,000;

wherein the cyclocarbonate (meth)acrylate monomer has the structure of Formula (A1):

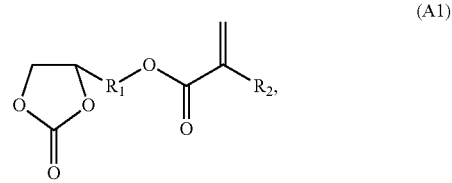

(A1)

wherein $R_1$ is selected from the group consisting of a linear or branched C1-C6 alkylene moiety, an alkylene-carbonate moiety, an alkylene-ester moiety, and an alkylene-amide moiety and $R_2$ is H or $CH_3$; and wherein the amounts of at least the oligomeric material, the cyclocarbonate, and the photoinitiator are selected such that the ink, when cured, exhibits a tear strength of 30 to 200 kN/m when measured according to ASTM D624.

2. The ink of claim 1, wherein the oligomeric curable material comprises one or more ethylenically unsaturated species having a dynamic viscosity of 1,000 to 250,000 cP at 50° C., when measured according to ASTM D2983.

3. The ink of claim 2, wherein the oligomeric curable material comprises one or more ethylenically unsaturated species having a dynamic viscosity of 1,000 to 200,000 cP at 50° C., when measured according to ASTM D2983.

4. The ink of claim 1, wherein the oligomeric curable material comprises one or more aliphatic urethane (meth) acrylates.

5. The ink of claim 1, wherein the oligomeric curable material is present in the ink in an amount of 25-50 wt. %, based on the total weight of the ink.

6. The ink of claim 1, wherein $R_1$ is a linear or branched C1-C4 alkylene moiety.

7. The ink of claim 1, wherein $R_2$ is H.

8. The ink of claim 1, wherein $R_1$ is $CH_2$ and $R_2$ is H.

9. The ink of claim 1, wherein the cyclocarbonate (meth) acrylate monomer is present in the ink in an amount of 20-30 wt. %, based on the total weight of the ink.

10. The ink of claim 1, wherein the ink further comprises one or more additional curable materials differing from the oligomeric curable material and the cyclocarbonate (meth) acrylate monomer.

11. The ink of claim 10, wherein the additional curable materials comprise an additional monomeric curable material.

12. The ink of claim 10, wherein the additional curable materials comprise an additional oligomeric curable material.

13. The ink of claim 1, further comprising at least one colorant.

14. The ink of claim 1, further comprising at least one filler.

15. The ink of claim 1, further comprising at least one inhibitor, at least one stabilizing agent, or a combination thereof.

16. The ink of claim 1, wherein the dynamic viscosity of the uncured ink is greater than 100 cP at 25° C., when measured according to ASTM D2983.

17. The ink of claim 16, wherein the dynamic viscosity of the uncured ink is greater than 100 cP and less than 5000 cP at 25° C., when measured according to ASTM D2983.

18. The ink of claim 1, wherein the ink, when cured, exhibits a volumetric polymerization shrinkage of no greater than 5% compared to the ink when uncured, wherein the volumetric polymerization shrinkage is measured according to ASTM D792.

19. The ink of claim 1, wherein the ink, when cured, exhibits a notched Izod impact strength of 50 to 200 J/m when measured according to ASTM D256.

20. A method of printing a three-dimensional article comprising:
selectively depositing layers of an ink in a fluid state onto a substrate to form the three-dimensional article,
wherein the ink comprises the ink of claim 1.

21. The method of claim 20 further comprising photocuring the ink.

22. A method of printing a three-dimensional article comprising:
retaining an ink in a fluid state in a container;
selectively applying energy to the ink in the container to solidify at least a portion of a first fluid layer of the ink, thereby forming a first solidified layer that defines a first cross-section of the article;
raising or lowering the first solidified layer to provide a second fluid layer of the ink at a surface of the fluid ink in the container; and
selectively applying energy to the ink in the container to solidify at least a portion of the second fluid layer of the ink, thereby forming a second solidified layer that defines a second cross-section of the article, the first cross-section and the second cross-section being bonded to one another in a z-direction,
wherein the ink comprises the ink of claim 1.

23. The method of claim 22, wherein selectively applying energy to the ink in the container comprises photocuring the ink.

24. The method of claim 22, wherein the method of printing has a print speed of 20-60 mm/hour.

25. A printed three-dimensional article formed from the ink of claim 1.

26. The ink of claim 1, wherein the ink, when cured, exhibits a tear strength of 80 to 200 kN/m when measured according to ASTM D624.

27. The ink of claim 1, wherein the ink, when cured, is at least 70% cross-linked.

* * * * *